(12) United States Patent
Takemura et al.

(10) Patent No.: US 9,640,749 B2
(45) Date of Patent: May 2, 2017

(54) PIEZOELECTRIC/ELECTROSTRICTIVE ELEMENT AND METHOD FOR MANUFACTURING THE SAME

(71) Applicants: NGK Insulators, Ltd., Nagoya-Shi (JP); NGK Ceramic Device Ltd., Komaki-Shi (JP)

(72) Inventors: Shinya Takemura, Komaki (JP); Takashi Ebigase, Nagoya (JP); Kenichi Tsuge, Nagoya (JP)

(73) Assignees: NGK Insulators, Ltd., Nagoya (JP); NGK Ceramic Device Ltd., Komaki-Shi (JP)

( * ) Notice: Subject to any disclaimer, the term of this patent is extended or adjusted under 35 U.S.C. 154(b) by 346 days.

(21) Appl. No.: 14/190,586

(22) Filed: Feb. 26, 2014

(65) Prior Publication Data

US 2014/0292159 A1    Oct. 2, 2014

(30) Foreign Application Priority Data

Mar. 29, 2013 (JP) .................................. 2013-070897

(51) Int. Cl.
*H01L 41/047* (2006.01)
*B41J 2/16* (2006.01)
(Continued)

(52) U.S. Cl.
CPC ............ *H01L 41/047* (2013.01); *B41J 2/161* (2013.01); *B41J 2/1629* (2013.01); *B41J 2/1631* (2013.01);
(Continued)

(58) Field of Classification Search
CPC ............... H01L 41/047; H01L 41/0475; H01L 41/0973
(Continued)

(56) References Cited

U.S. PATENT DOCUMENTS

2006/0082256 A1*  4/2006  Bibl ..................... B41J 2/14233
                                                     310/328
2007/0001544 A1*  1/2007  Geefay ..................... H03H 3/02
                                                     310/311
(Continued)

FOREIGN PATENT DOCUMENTS

JP       2005-051840 A     2/2005
JP       2008-211047 A     9/2008
(Continued)

OTHER PUBLICATIONS

Xiao-Hui Xu et al., "Preparation of a High-Quality PZT Thick Film with Performance Comparable to those of Bulk Materials for Applications in MEMS," Journal of Micromeehanics & Microengineering, Institute of Physics Publishing, Bristol, GB, vol. 18, No. 6, Jun. 1, 2008, pp. 6501-6507.
(Continued)

*Primary Examiner* — Derek Rosenau
(74) *Attorney, Agent, or Firm* — Burr & Brown, PLLC

(57) ABSTRACT

A piezoelectric/electrostrictive element having a piezoelectric body, a through-hole electrode, a first electrode, a second electrode, a third electrode. The piezoelectric body includes a through-hole in communication with a first main surface and a second main surface. The through-hole electrode is formed on an inner side surface of the through-hole. The first electrode is formed on the first main surface of the piezoelectric body, and connected to the through-hole electrode. The second electrode is formed on the second main surface of the piezoelectric body, and is connected to the through-hole electrode. The third electrode is formed on the second main surface of the piezoelectric body and isolated from the second electrode. A calculated average roughness in the inner side surface is larger than 0.11 microns and smaller than 16 microns. A maximum height roughness in the inner side surface is larger than 0.2 microns and smaller than 20 microns.

5 Claims, 6 Drawing Sheets

(51) Int. Cl.
H01L 41/09 (2006.01)
H01L 41/29 (2013.01)

(52) U.S. Cl.
CPC ........ B41J 2/1645 (2013.01); H01L 41/0475 (2013.01); H01L 41/0973 (2013.01); H01L 41/29 (2013.01); Y10T 29/42 (2015.01)

(58) Field of Classification Search
USPC ........................................ 310/320, 321, 365
See application file for complete search history.

(56) References Cited

U.S. PATENT DOCUMENTS

| 2007/0176520 A1* | 8/2007 | Yoshioka | H01L 41/0471 |
| | | | 310/365 |
| 2009/0026887 A1* | 1/2009 | Fujii | B41J 2/14233 |
| | | | 310/330 |
| 2011/0227457 A1 | 9/2011 | Ishikawa et al. | |
| 2011/0289744 A1 | 12/2011 | Ohnishi et al. | |

FOREIGN PATENT DOCUMENTS

| JP | 2009-005143 A1 | 1/2009 |
| JP | 2010-050726 A1 | 3/2010 |

OTHER PUBLICATIONS

S. Ezhivalavan et al., *"Ferroelectric Properties of Wet-Chemical Patterned $PbZr_{0.52}Ti_{0.48}O_3$ Films,"* Applied Physics Letters, American Institute of Physics, vol. 86, No. 7, Feb. 7, 2005, pp. 072901-072903.

Extended European Search Report (Application No. 14159739.3) dated Sep. 1, 2014.

Japanese Office Action (Application No. 2013-070897) dated Nov. 22, 2016 (with English translation).

* cited by examiner

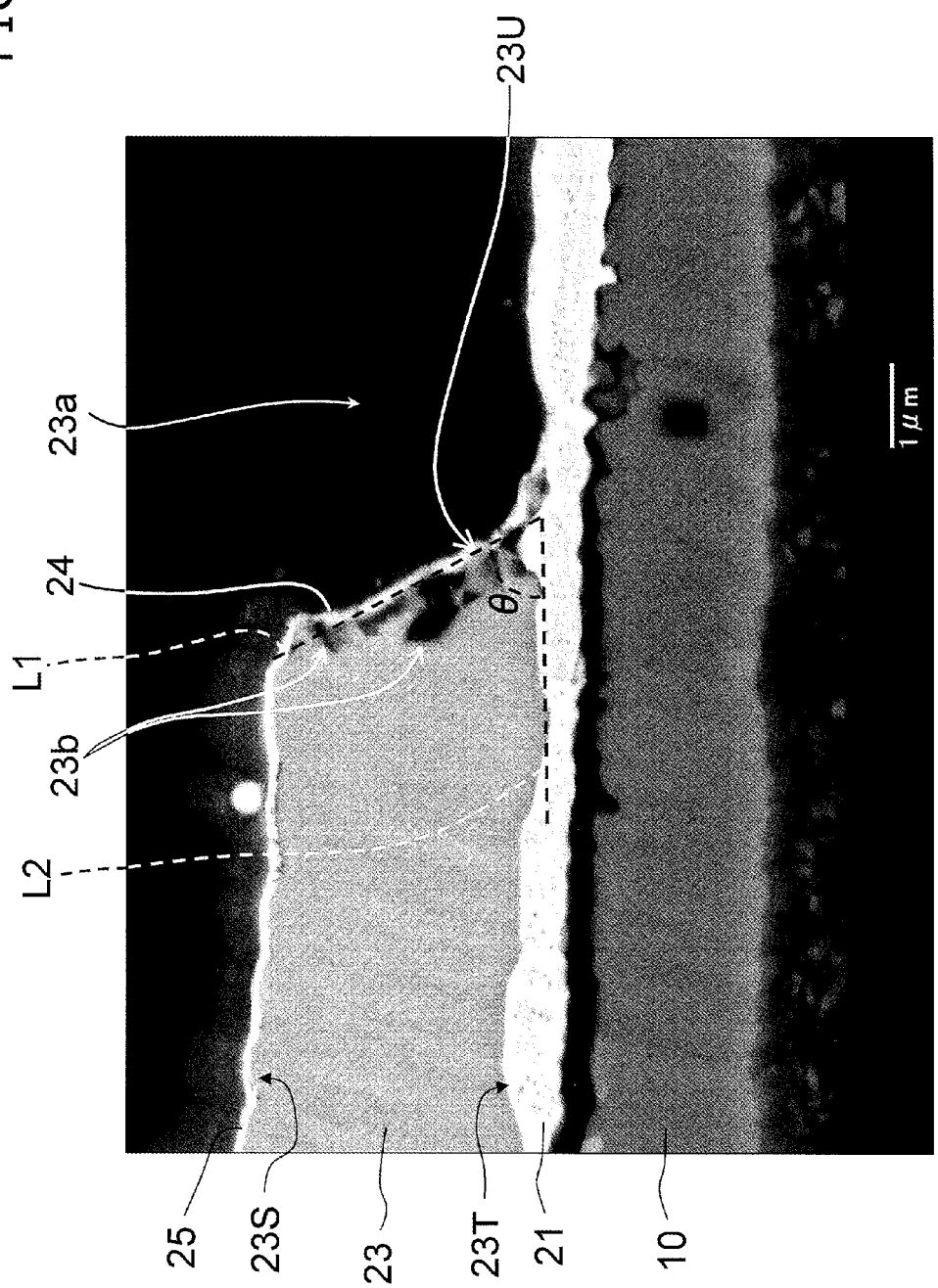

PIEZOELECTRIC/ELECTROSTRICTIVE ELEMENT AND METHOD FOR MANUFACTURING THE SAME

CROSS-REFERENCE TO RELATED APPLICATIONS

This application claims priority under 35 U.S.C. §119 to Japanese Patent Application No. 2013-70897, filed on Mar. 29, 2013. The entire disclosure of Japanese Patent Application No. 2013-70897 is hereby incorporated herein by reference.

BACKGROUND OF THE INVENTION

1. Field of the Invention

The technology disclosed herein relates to a piezoelectric/electrostrictive element provided with a through-hole electrode, and to a method for manufacturing the same.

2. Description of Related Art

A conventional piezoelectric/electrostrictive element is provided with a through-hole electrode that is filled into a through-hole of a piezoelectric body (see Japanese Patent Application Laid-Open No. 2008-211047 and No. 2005-51840).

More specifically, the piezoelectric/electrostrictive element includes a first upper electrode, a second upper electrode and a lower electrode. The first upper electrode and the second upper electrode are formed on an upper surface of the piezoelectric body. The lower electrode is formed on a lower surface of the piezoelectric body. The through-hole electrode is connected to the lower electrode and the second upper electrode.

This type of piezoelectric/electrostrictive element enables application of a voltage to the first upper electrode and the lower electrode by application of a voltage to the first upper electrode and the second upper electrode.

SUMMARY OF THE INVENTION

The through-hole electrode is preferably configured to use an electrode material such as an electrode paste that contains a conductive material, and filling is preferably executed by use of a coating method such as screen printing or the like. In order to reduce the amount of the electrode material that is used, rather than filling the electrode material into the through-hole, the through-hole electrode is formed by a thin coat of electrode material onto an inner side surface of the through-hole.

However, it is difficult to evenly coat the inner side surface of the through-hole with the electrode material as a result of wetting difficulties caused by the relationship of the surface tension between the electrode material and the inner side surface of the through-hole, and therefore there is the problem that the through-hole electrode has a tendency to undergo disconnection during drying or during coating of the electrode material.

In light of the circumstances described above, the object of the technology disclosed herein is to provide a piezoelectric/electrostrictive element and a method for manufacturing the same that enables inhibition of disconnection of a through-hole electrode.

A piezoelectric/electrostrictive element has a piezoelectric body, a through-hole electrode, a first electrode, a second electrode, a third electrode. The piezoelectric body includes a through-hole in communication with a first main surface and a second main surface. The through-hole electrode is formed on an inner side surface of the through-hole. The first electrode is formed on the first main surface of the piezoelectric body. The first electrode is connected to the through-hole electrode. The second electrode is formed on the second main surface of the piezoelectric body. The second electrode is connected to the through-hole electrode. The third electrode is formed on the second main surface of the piezoelectric body. The third electrode is isolated from the second electrode. A calculated average roughness in the inner side surface is larger than 0.11 microns and smaller than 16 microns. A maximum height roughness in the inner side surface is larger than 0.2 microns and smaller than 20 microns.

The technology disclosed herein provides a piezoelectric/electrostrictive element and a method for manufacturing the same that enables inhibition of disconnection of a through-hole electrode.

BRIEF DESCRIPTION OF DRAWINGS

Referring now to the attached drawings which form a part of this original disclosure:

FIG. 3 illustrates a SEM image of a cross section of the piezoelectric/electrostrictive element;

DETAILED DESCRIPTION OF THE INVENTION

Figure 1:
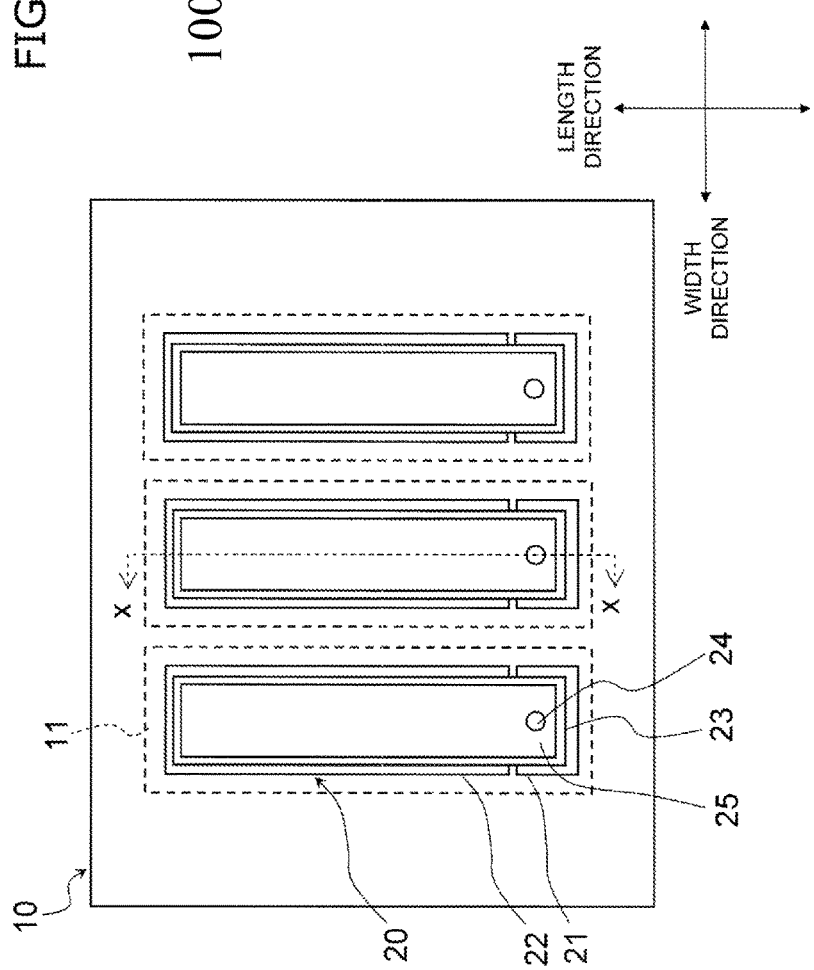
FIG. 1 is a plan view illustrating a configuration of an actuator.

An actuator for use in an inkjet head configured to apply the piezoelectric/electrostrictive element will be described below making reference to the figures. The piezoelectric/electrostrictive element can be applied to various uses such as an oscillation circuit, various types of sensors or an injector actuator.

The same or similar portions disclosed in the following figures are denoted by the same or similar reference numerals. However, the figures are merely schematic, and the ratios of the respective dimensions or the like may differ from the actual values. Therefore, the actual dimensions or the like should be determined by making reference to the following description. In addition, it is naturally the case that portions are included that exhibit differences in relation to ratios or in relation to the relationship between mutual dimensions in different figures.

Configuration of Actuator 100

Figure 2:
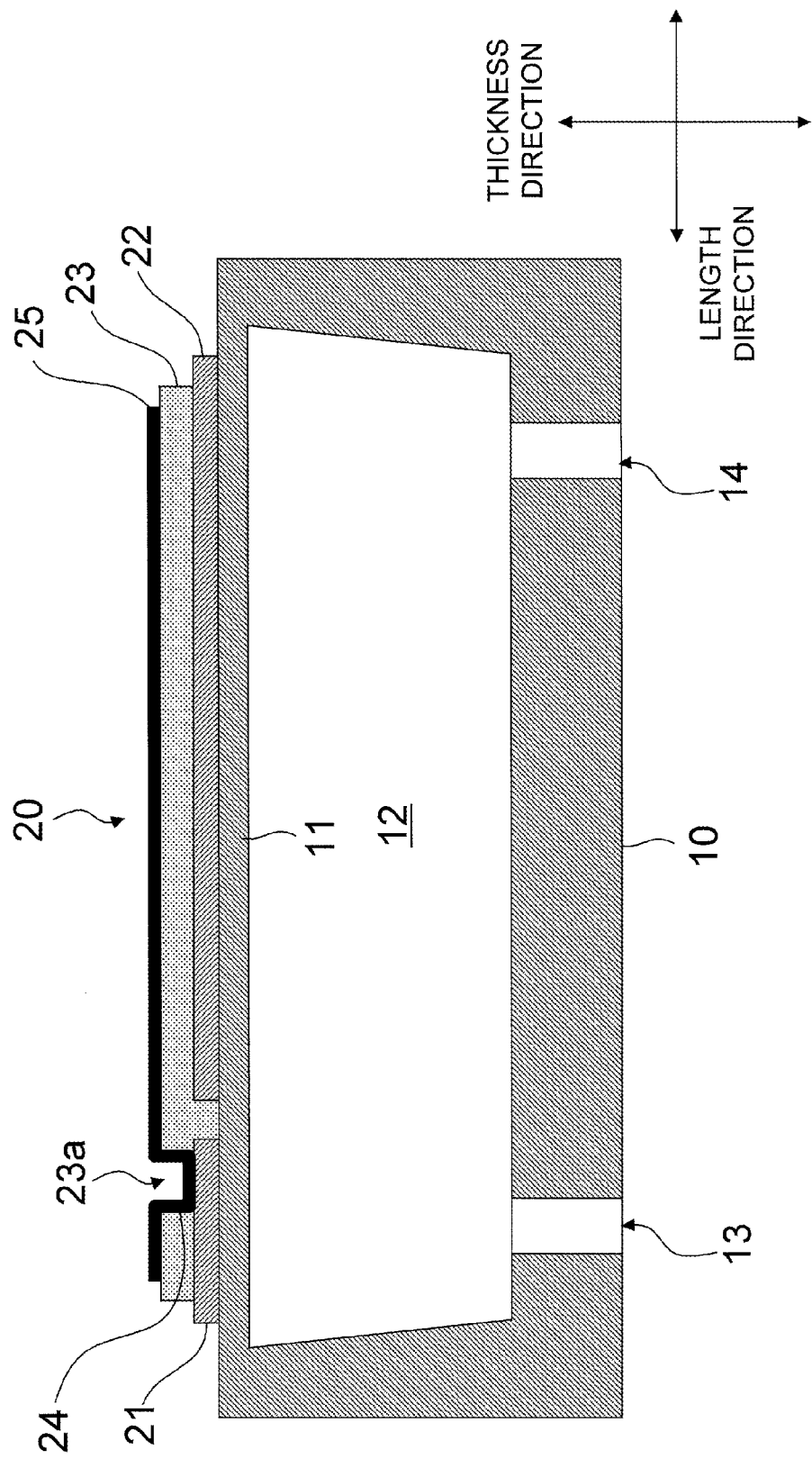
FIG. 2 is a sectional view along the line X-X in FIG. 1.

The configuration of the actuator 100 will be described making reference to the figures. FIG. 1 is a plan view illustrating a configuration of the actuator 100. FIG. 2 is a sectional view along the line X-X in FIG. 1. FIG. 3 illustrates a SEM image of a cross section of the piezoelectric/electrostrictive element.

In the following description, as illustrated in FIG. 1, the direction in which the piezoelectric/electrostrictive element 20 extends is termed the "length direction", and the direction that is orthogonal to the length direction is termed the "width direction". As illustrated in FIG. 2, the direction that is orthogonal to the length direction and the width direction is termed the "thickness direction".

The actuator 100 includes a substrate 10 and a plurality of piezoelectric/electrostrictive elements 20.

1. Substrate 10

The substrate 10 is a plate-shaped fired body. The substrate 10 is configured from an insulating material. The insulating material used to configure the substrate 10 includes for example, stabilized zirconium oxide, aluminum oxide, magnesium oxide, mullite, aluminum nitride and silicon nitride, or the like.

The insulating material that configures the substrate 10 is not limited to a ceramic material and may be configured by a glass material, a resin material, or the like. Furthermore, the particles that configure the substrate 10 may be a monocrystal, polycrystal, or an amorphous material.

The substrate 10 includes a diaphragm 11, a pressure chamber 12 and a discharge nozzle 13, and an ink guide port 14.

The diaphragm 11 is a thin plate configured to support the piezoelectric/electrostrictive element 20. The diaphragm 11 vibrates (displaces) in the thickness direction in response to expansion and contraction of the piezoelectric/electrostrictive element 20. The pressure chamber 12 is a cavity provided below the diaphragm 11. The pressure chamber 12 retains ink injected from an ink guide port 14. The discharge nozzle 13 extends downwardly from the pressure chamber 12. The ink retained in the pressure chamber 12 is discharged from the discharge nozzle 13 in response to the vibration of the diaphragm 11.

2. Piezoelectric/Electrostrictive Element 20

The piezoelectric/electrostrictive element 20 extends in the length direction on the substrate 10. A plurality of piezoelectric/electrostrictive elements 20 is mutually aligned in parallel.

The piezoelectric/electrostrictive element 20 includes a first lower electrode 21, a second lower electrode 22, a piezoelectric body 23, a through-hole electrode 24, and an upper electrode 25. In the embodiments, the upper electrode 25 is an example of "a first electrode", the first lower electrode 21 is an example of "a second electrode", and the second lower electrode 22 is an example of "a third electrode".

2-1 First Lower Electrode 21

The first lower electrode 21 is a thin film-shaped fired body that is disposed on the diaphragm 11. The first lower electrode 21 is connected to the through-hole electrode 24. One end portion of the first lower electrode 21 projects from one end portion of the piezoelectric body 23. The first lower electrode 21 is formed a size smaller than the second lower electrode 22. The length of the first lower electrode 21 is for example 1 micron to 500 microns. The width of the first lower electrode 21 is for example 30 microns to 500 microns. The thickness of the first lower electrode 21 is for example 0.1 microns to 10.0 microns.

The first lower electrode 21 is configured from an acid resistant conductive material. The conductive material includes for example noble metals such as platinum (Pt) or the like, in addition to conductive polymers and conductive oxides.

2-2 Second Lower Electrode 22

The second lower electrode 22 is a thin film-shaped fired body disposed on the diaphragm 11. The second lower electrode 22 is separated from the first lower electrode 21 and is not connected to the through-hole electrode 24. One end portion of the second lower electrode 22 projects from the other end potion of the piezoelectric body 23. The second lower electrode 22 is formed with a size that is larger than the first lower electrode 21. The length of the second lower electrode 22 is for example 500 microns to 5000 microns. The width of the second lower electrode 22 is for example 30 microns to 500 microns. The thickness of the second lower electrode 22 is for example 0.1 microns to 10.0 microns.

The second lower electrode 22 may be formed using the same conductive material as the first lower electrode 21.

2-3 Piezoelectric Body 23

The piezoelectric body 23 is a thin film-shaped fired body disposed on the first and second lower electrodes 21, 22. The piezoelectric body 23 includes a first main surface 23S and a second main surface 23T. The upper electrode 25 is disposed on the first main surface 23S. The first and second lower electrodes 21, 22 are disposed on the second main surface 23T. When a voltage is applied to the first and second lower electrodes 21, 22, a voltage is applied to the upper electrode 25 and the second lower electrode 22, and consequently, the piezoelectric body 23 contracts and expands in a direction that is perpendicular to the thickness direction. The diaphragm 11 vibrates (displaces) in the thickness direction in response to the contraction or expansion of the piezoelectric body 23.

The piezoelectric body 23 is formed with a size that is smaller than or equal to the combined size of the first and second lower electrodes 21, 22. The length of the piezoelectric body 23 is for example 500 microns to 5000 microns. The width of the piezoelectric body 23 is for example 30 microns to 500 microns. The thickness of the piezoelectric body 23 is for example 0.5 microns to 20.0 microns. The piezoelectric body 23 is configured from a polycrystalline piezoelectric material. The piezoelectric material includes for example lead titanate zirconate (PZT), or the like.

The piezoelectric body 23 has a through-hole 23a that communicates with the first main surface 23S and the second main surface 23T. Although the through-hole 23a may be formed with a circular shape of 1.0 micron to 500 microns, there is no limitation on the planar shape or size of the through-hole 23a. The through-hole 23a may be configured as a quadrilateral, or in a linear configuration.

As illustrated in FIG. 3, a plurality of recessed portions 23b is formed in an inner side surface 23U of the through-hole 23a. The recessed portions 23b are preferably formed on the whole surface of the inner side surface 23U, however there is no requirement for a uniform disposition. The shape, aperture size and depth or the like of the recessed portions 23b may differ on an individual basis. The shape of the recessed portions 23b for example may be configured as a circle, an oval, or a rectangle, and there is no limitation in this regard. The circle correspondence diameter of the aperture size of the recessed portion 23b may be 0.1 micron to 20 microns, and the depth of the recessed portions 23b may be 0.1 microns to 30 microns.

The calculated average roughness Ra of the inner side surface 23U formed by the plurality of recessed portions 23b is preferably greater than 0.11 microns and less than 16 microns. The maximum height roughness Rz of the inner side surface 23U is preferably larger than 0.2 microns and smaller than 20 microns. The calculated average roughness Ra and the maximum height roughness Rz for example may be calculated using a white-light interference non-contact surface roughness meter.

An inner portion of the recessed portions 23b is configured as a cavity. That is to say, the inner portion of the recessed portions 23b is not filled with the through-hole electrode 24. However, as described below, electrode material is filled into the inner portion of the recessed portions 23b in the coating processing step of the electrode material, and thereafter, the electrode material in the recessed portions 23b moves to the outside in the firing processing step of the electrode material.

As illustrated in FIG. 3, the inner side surface 23U of the through-hole 23a is inclined relative to the second main surface 23T. FIG. 3 illustrates a straight line L1 that is linear fitted to the inner side surface 23U by the least squares method and a straight line L2 that is linear fitted to the second main surface 23T by the least squares method. The interior angle theta (θ) formed by the straight line L1 and the straight line L2 as represented by the least squares method is preferably at least 55 degrees and less than or equal to 110 degrees.

2-4 Through-Hole Electrode 24

The through-hole electrode 24 is a fired film of a conductive material that is formed on the inner side surface 23U of the through-hole 23a. The through-hole electrode 24 preferably covers the whole of the inner side surface 23U. The through-hole electrode 24 is connected to the upper electrode 25 on a first main surface 23S side, and is connected to the first lower electrode 21 on a second main surface 23T side. In the present embodiment, the through-hole electrode 24 is formed integrally with the upper electrode 25 by a coating method. The coating method as used herein means screen printing method, spin coating method, spray coating method or coating methods to apply a liquid with a dispenser or the like.

The thickness of the through-hole electrode 24 for example may be 0.01 microns to 10 microns. The thickness of the through-hole electrode 24 is preferably uniform, but may exhibit localized thinness.

As illustrated in FIG. 3, the through-hole electrode 24 does not reach into the recessed portion 23b of the inner side surface 23U. The through-hole electrode 24 is disposed to cover an opening of the recessed portion 23b.

The through-hole electrode 24 is configured from an acid resistant conductive material. The conductive material includes noble metals such as gold (Au), silver (Ag), platinum (Pt), or copper (Cu), or an alloy formed from such noble metals. However, the conductive material that configures the through-hole electrode 24 is not limited to a noble metal, and includes a conductive polymer or a conductive oxide.

2-5 Upper Electrode 25

The upper electrode 25 is a thin film-shaped fired body disposed on the piezoelectric body 23. The upper electrode 25 substantially covers the whole surface of the first main surface 23S. The upper electrode 25 is connected to the through-hole electrode 24. In the present embodiment, the upper electrode 25 is integrally formed with the through-hole electrode 24 by the coating method.

In plan view, the upper electrode 25 is formed with a size that is smaller than or equal to the size of the piezoelectric body 23. The length of the upper electrode 25 is for example 500 microns to 5000 microns. The width of the upper electrode 25 is for example 30 microns to 500 microns. The thickness of the upper electrode 25 is for example 0.01 microns to 10.0 microns. The upper electrode may be formed using the same conductive material as the through-hole electrode 24.

Method for Manufacturing Actuator 100

Next, the method for manufacturing the actuator 100 will be described making reference to the figures.

Firstly, a laminated body is prepared by laminating a plurality of green sheets that is configured by the insulating material used in the substrate 10. Each green sheets is punched into a predetermined pattern. The inner portion of the laminated body is formed into a cavity corresponding to the pressure chamber 12, the discharge nozzle 13 and the ink guide port 14.

Figure 4A:
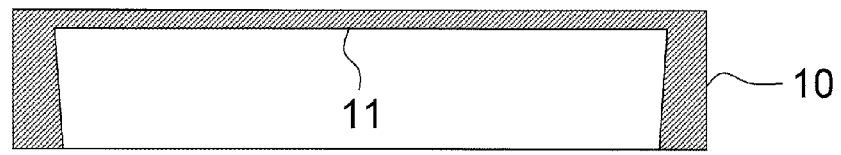
FIG. 4A, FIG. 4B and FIG. 4C illustrate a method for manufacturing the actuator.

Next, as illustrated in FIG. 4A, the substrate 10 is prepared by firing of the laminated body.

Then, a spin coat method or the like is used to coat a photoresist (negative photoresist) onto the substrate 10 and thereby form a photoresist film.

Then, the photoresist film is patterned by use of photolithography into a shape that corresponds to the first and the second lower electrodes 21, 22.

Then, a spray coat method or the like is used to coat a catalytic solution containing palladium for example onto openings of the photoresist film.

Figure 4B:
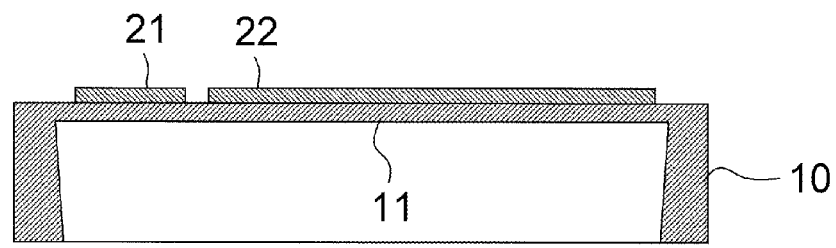

Next, as illustrated in FIG. 4B, after removing the photoresist film, an electroplating method or the like is used to form the first and the second lower electrodes 21, 22 as a ground for the catalyst.

Next, a green sheet for the piezoelectric body 23 is disposed on the first and the second lower electrodes 21, 22. In addition to a piezoelectric material, the green sheet for the piezoelectric body 23 may contain $Pb_3O_4$ powder or $Bi_2O_3$ powder as a sintering auxiliary, a dispersing agent, an organic binder, or the like.

Figure 4C:
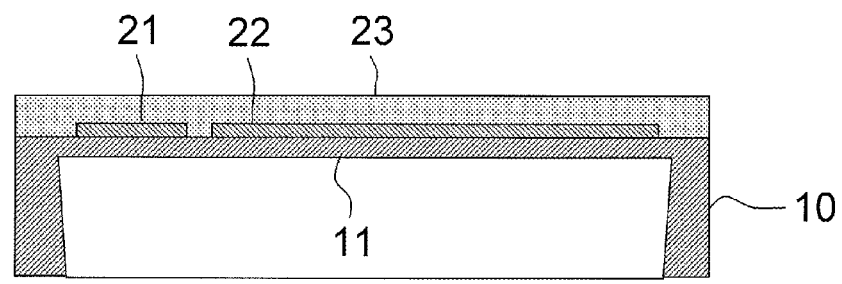

Then, as illustrated in FIG. 4C, the green sheet for the piezoelectric body 23 is fired under predetermined conditions (firing temperature 800 degrees C. to 1200 degrees C., firing time 0.5 h to 5.0 h) to form the piezoelectric body 23. However, as used herein, the piezoelectric body 23 is formed as a single large film-shaped body.

Then, a spin coat method or the like is used to coat a photoresist (positive resist) onto the piezoelectric body 23 and thereby form a photoresist film R1.

Figure 5A:
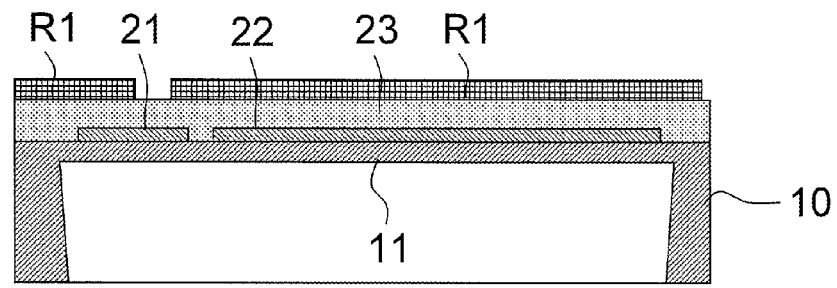
FIG. 5A, FIG. 5B and FIG. 5C illustrate a method for manufacturing the actuator.

Then, as illustrated in FIG. 5A, the photoresist film R1 is patterned by use of photolithography into a shape that corresponds to the through-hole 23a.

Figure 5B:
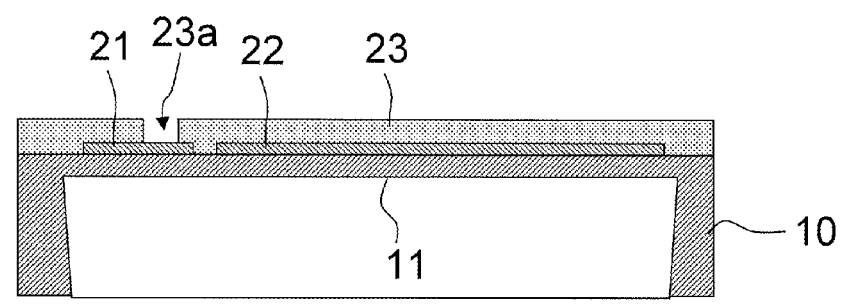

Then, as illustrated in FIG. 5B, a through-hole 23a is formed by etching the piezoelectric body 23 by use of an etching liquid for use in relation to the piezoelectric material of the piezoelectric body 23, and then the photoresist film R1 is removed. The etching liquid may be a mixed liquid of an acidic aqueous solution (for example, 10% concentration of diluted hydrochloric acid), trace amounts of ammonium fluoride, thickening agent, complexing agent, surface active agents, or the like.

In the etching step, the number and size of the recessed portions 23a and the shape of the through-hole 23a can be adjusted by adjusting the etching conditions. More specifically, the height of the nozzle for discharge of the liquid, the liquid discharge pressure, the oscillation frequency of the substrate 10, and the processing time can be controlled to thereby enable adjustment of the interior angle theta, the maximum height roughness Rz and the calculated average roughness Ra of the inner side surface 23U. It is preferred that the calculated average roughness Ra is greater than 0.11 microns and less than 16 microns, the maximum height roughness Rz is greater than 0.2 microns and less than 20 microns, and the interior angle theta is at least 55 degrees and less than or equal to 110 degrees.

Then, a spin coat method or the like is used to coat a photoresist (positive resist) onto the piezoelectric body 23 and thereby form a photoresist film R2.

Figure 5C:
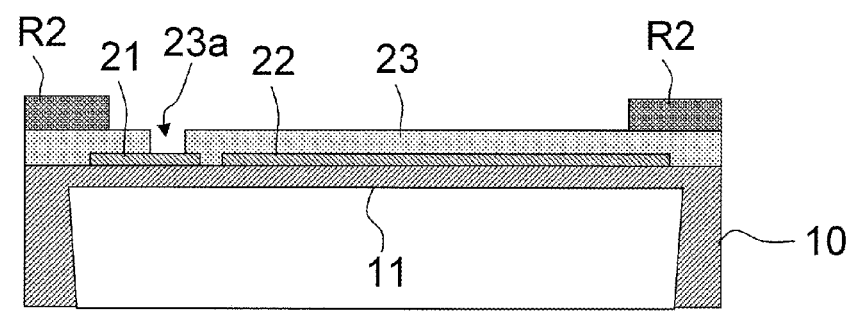

Then, as illustrated in FIG. 5C, the photoresist film R2 is patterned by use of photolithography into a shape that corresponds to the upper electrode 25.

Figure 6A:
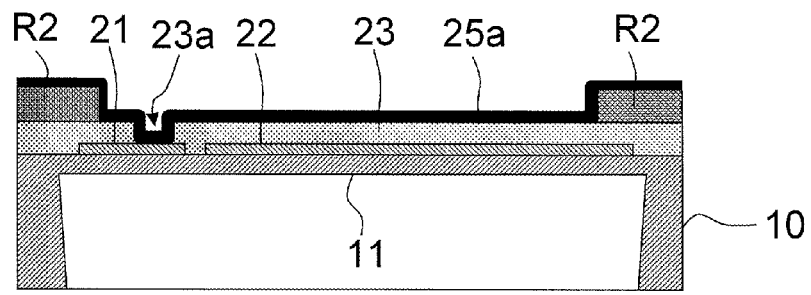
FIG. 6A, FIG. 6B and FIG. 6C illustrate a method for manufacturing the actuator.

Next as illustrated in FIG. 6A, a coating method such as a spin coat method or the like is used to coat the electrode material 25a that contains a conductive material onto the patterned photoresist film R2. The electrode material 25a is coated continuously not only onto the surface of the piezoelectric body 23 but also onto the inner side surface 23U. At this time, as described above, since a suitable roughness is applied to the inner side surface 23U of the through-hole 23a, the electrode material 25a is maintained in a configuration of covering the whole surface of the inner side surface 23U by filling of the electrode material 25a into the inner portion of the recessed portions 23a.

Figure 6B:
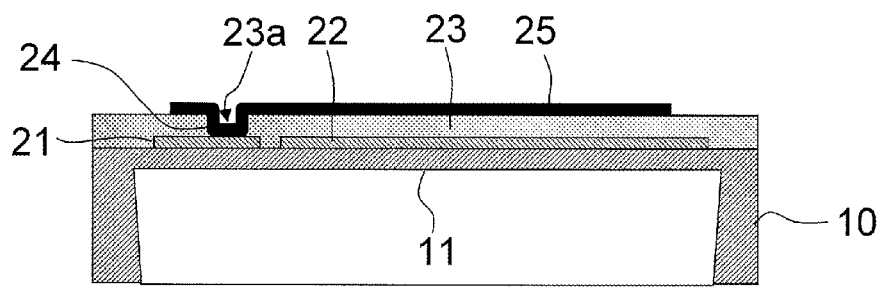

Next as illustrated in FIG. 6B, after removing the photoresist film R2, the electrode material 25a is fired under predetermined conditions (firing temperature 400 degrees C. to 1000 degrees C., firing time 1 min to 2.0 hr) to form the through-hole electrode 24 and the upper electrode 25. In the firing process, the electrode material 25a that is filled into the inner portion of the recessed portion 23b moves to the outside of the recessed portion 23b, and thereby enables preparation of a through-hole electrode 24 that is configured with a uniform thin film.

Then, a spin coat method or the like is used to coat a photoresist (positive resist) onto the through-hole electrode 24 and the upper electrode 25 and thereby form a photoresist film R3.

Figure 6C:
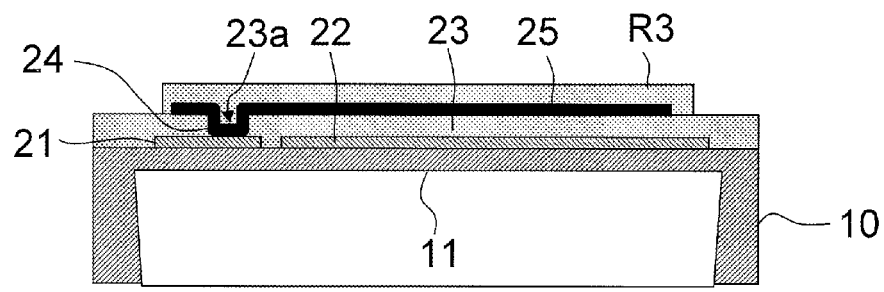

Then, as illustrated in FIG. 6C, the photoresist film R3 is patterned by use of photolithography to cover the through-hole electrode 24 and the upper electrode 25.

Next, the piezoelectric body 23 is etched by an etching liquid for use in relation to a piezoelectric material to thereby pattern the piezoelectric body 23 as illustrated in FIG. 1. The etching liquid may be a mixed liquid of an acidic aqueous solution (for example, 10% concentration of diluted hydrochloric acid), trace amounts of ammonium fluoride, a thickening agent, a complexing agent, a surface active agent, or the like.

In this manner, the actuator 100 is completed.
Operation and Effect

The calculated average roughness Ra of the inner side surface 23U of the through-hole 23a is greater than 0.11 microns and less than 16 microns, and the maximum height roughness Rz of the inner side surface 23U of the through-hole 23a is greater than 0.2 microns and less than 20 microns.

Since a suitable roughness is applied to the inner side surface 23U of the through-hole 23a, the relationship of the surface tension between the electrode material and the inner side surface 23U of the electrode material 25a is improved, and therefore wetting of the electrode material 25a is facilitated, and it is possible to inhibit disconnection of the through-hole electrode 24 during drying of the electrode material 25a.

Other Embodiments

The technology disclosed herein is not limited to the above embodiments, and includes various modifications or variations within a scope that does not depart from the scope of the present invention.

For example, in the above embodiment, although a single upper electrode 25 is formed on the first main surface 23S of the piezoelectric body 23, and two first and second lower electrodes 21, 22 are formed on the second main surface 23S, the reverse configuration of the electrode structure is also possible. That is to say, two first and second upper electrodes may be formed on the first main surface 23S and a single lower electrode may be formed on the second main surface 23S. In this configuration, the first upper electrode and the lower electrode may be connected to the through-hole electrode 24.

EXAMPLES

The examples of the present invention will be described below. However, the present invention is not limited to the examples described below.

In the following description, inkjet head actuators according to Samples No. 1 to 11 were prepared.

Firstly, a plurality of green sheets formed by partially stabilized zirconia slurry was laminated to thereby prepare a laminated body having a thickness of 250 microns. Each green sheets was punched into a predetermined pattern to form a cavity (length 1 mm, width 80 microns, depth 60 microns) corresponding to the pressure chamber and a through hole corresponding to the discharge nozzle in the inner portion of the laminated body.

Next, the substrate was prepared by firing of the laminated body for 2 hours at 1450 degrees C.

Then, a spin coater was used to coat a negative photoresist liquid onto the surface of the substrate and was dried to thereby form a resist film with a thickness of 6 microns.

Then, a light shielding liquid that contains carbon black was poured from the discharge nozzle into the pressure chamber and degassing was performed in a vacuum chamber at 6.7 Pa.

Next, an exposure apparatus (multilight manufactured by Ushio (Inc.)) was used to apply ultraviolet light (integral of light 60 mJ/cm$^2$) having a wavelength of 365 nm, 405 nm and 436 nm from the back surface side of the substrate for one minute. In this manner, the light shielding liquid was used as a mask to expose and pattern the resist film.

Then, a spray coater was used to coat a catalytic solution containing palladium (manufactured by Uemura & Co. Ltd) onto the opening of the photoresist film.

Next, after removing the photoresist film, platinum non-electrolytic plating (manufactured by Metalor Technologies Japan) was used to form the lower electrode.

Next, a slurry containing a plasticizer, a dispersing agent, an organic binder, $Pb_3O_4$ and $Bi_2O_3$ powder as a sintering auxiliary, and a piezoelectric powder formed from an 0.2Bi($Ni_{1/3}Nb_{2/3}$)$O_3$+0.8 PZT composition was formed to prepare a green sheet having a thickness of 8 microns.

Then, the green sheet was adhered onto the lower electrode in a vacuum chamber and a degreasing process was performed.

Next, the green sheet was fired for two hours at 1000 degrees C. to thereby prepare a single film-shaped piezoelectric body (thickness 3 microns).

Then, a spray coater was used to coat a positive resist liquid (manufactured by Tokyo Ohka Kogyo (Co., Ltd.)) onto the piezoelectric body, and dried.

Next, a glass mask was used to apply ultraviolet light (integral of light 60 mJ/cm$^2$) having a wavelength of 365 nm, 405 nm and 436 nm for one minute from the surface by use of an exposure apparatus (multilight manufactured by Ushio (Inc.)). In this manner, the resist film is patterned to a shape corresponding to a circular through-hole having a diameter of 30 microns.

Next, the through-hole was formed according to the conditions shown in Table 1. More specifically, a through-hole was formed in Sample No. 1 and Samples No. 4 to 11 by use of an etching method, and the through-hole in Samples No. 2 and 3 were formed by a blast method. In Sample No. 1 and Samples No. 4 to 11, an etchant was used that was prepared by adding trace amounts of ammonium fluoride, a thickening agent, a complexing agent, and a surface active agent to 10% concentration of diluted hydrochloric acid (fluorine concentration less than 1%). The size of all the through-holes was a circular shape having a diameter of 30 microns.

In the etching processing step, the interior angle with the surface roughness of the inner side surface of the through-hole was adjusted by controlling the conditions for blasting and the conditions for etching as shown in Table 1. The calculated average roughness Ra, the maximum height roughness Rz and the interior angle theta (refer to FIG. 3) are shown in Table 1. The measurement of the calculated average roughness Ra and the maximum height roughness Rz was performed using a white-light interference non-contact surface roughness meter (manufactured by Canon Inc.: zygo NewView 7300). A cross sectional view of the through-hole was imaged using a scanning electron microscope (acceleration voltage 15 kV) to thereby measure the interior angle theta (θ) by linear fitting using a least squares method to the inner side surface and lower surface on the image.

Then, after patterning the resist film in the same manner as the formation processing step of the lower electrode, a spray coater was used to coat the electrode material onto the piezoelectric body. The electrode material was an Au resinate paste. At this time, the electrode material was coated uniformly to thereby form a connection from the surface of the piezoelectric body to the inner side surface of the through-hole.

piezoelectric body was configured to 75 microns. Thereafter, the piezoelectric body was washed in distilled water and dried at 110 degrees C.

Surface Roughness of Inner Side Surface of Through-Hole

In the through-hole formation processing step described above, the calculated average roughness Ra and the maximum height roughness Rz on the inner side surface of the through-hole in Samples No. 1 to 11 were measured. The measurement of the calculated average roughness Ra and the maximum height roughness Rz was performed using a white-light interference non-contact surface roughness meter (manufactured by Canon Inc.: zygo NewView 7300). The measurement results are shown in Table 1.

Interior Angle of Inner Side Surface of Through-Hole

A cross sectional view of the piezoelectric body of Samples No. 1 to 11 was imaged using a scanning electron microscope (acceleration voltage 15 kV) to acquire an SEM image. Linear fitting using a least squares method was applied to the respective inner side surface and lower surface on the SEM image to thereby measure the interior angle theta for both lines. The measurement results are shown in Table 1.

Disconnection of Through-Hole Electrode

The presence or absence of a disconnection in the through-hole electrode in Sample No. 1 to 11 was confirmed by use of a microscope. The evaluation results are shown in Table 1. In Table 1, a sample in which there is no confirmed disconnection is denoted by o and a sample in which there is a confirmed disconnection is denoted by x.

TABLE 1

| Sample No. | Method | Forming Conditions of Through-hole | | | | Calculated Average Roughness Ra | Maximum Height Roughness Rz | Interior Angle θ | Disconnection in the Through-hole Electrode |
|---|---|---|---|---|---|---|---|---|---|
| | | Height of the nozzle (cm) | Discharge Pressure (MPa) | Oscillation Frequency of the Substrate (Hz) | Time (min) | | | | |
| 1 | Etching | 8 | 0.1 | nothing | 3 | 0.21 | 0.56 | 55 | ○ |
| 2 | Blast | 8 | 0.05 | nothing | 2 | 0.07 | 0.18 | 55 | X |
| 3 | Blast | 5 | 0.05 | nothing | 2 | 0.06 | 0.17 | 45 | X |
| 4 | Etching | 2 | 0.1 | nothing | 2 | 0.32 | 0.68 | 110 | ○ |
| 5 | Etching | 1 | 0.1 | nothing | 2 | 0.27 | 0.77 | 115 | X |
| 6 | Etching | 16 | 0.1 | nothing | 2 | 16 | 20 | 65 | ○ |
| 7 | Etching | 16 | 0.05 | nothing | 2 | 17 | 20 | 65 | X |
| 8 | Etching | 8 | 0.1 | 1 | 2 | 0.11 | 0.2 | 55 | ○ |
| 9 | Etching | 8 | 0.15 | 1 | 2 | 0.1 | 0.21 | 60 | X |
| 10 | Etching | 16 | 0.3 | nothing | 2 | 15 | 25 | 70 | X |
| 11 | Etching | 8 | 0.15 | 1.5 | 2 | 0.12 | 0.19 | 65 | X |

Next, the electrode material was fired for 0.5 hours at 600 degrees C. to thereby prepare the upper electrode (width 75 microns, thickness 0.1 micron) and a through-hole electrode.

Then, a spray coater was used to coat a positive resist liquid (manufactured by Tokyo Ohka Kogyo (Co., Ltd.)) onto the upper electrode, and dried.

Then a glass mask was used to expose the resist film and thereby form a protective film to cover the upper electrode.

Next, an etchant was prepared by adding trace amounts of ammonium fluoride, a thickening agent, a complexing agent, and a surface active agent to 10% concentration of diluted hydrochloric acid (fluorine concentration less than 1%), and the etchant and the piezoelectric body are heated to 40 degrees C.

Then, the etchant was sprayed for two minutes from a nozzle separated by 8 cm from the substrate to thereby etch the piezoelectric body. In this manner, the width of the As shown in Table 1, no disconnection was confirmed in the through-hole electrode in Samples No. 1, 4, 6 and 8. Therefore, it is shown that it is preferred that the calculated average roughness Ra is larger than 0.11 microns and smaller than 16 microns and that the maximum height roughness Rz is larger than 0.2 microns and smaller than 20 microns.

In Sample No. 5, notwithstanding the fact that the calculated average roughness Ra and the maximum height roughness Rz are suitable, a disconnection was confirmed in the through-hole electrode. Therefore, it is shown that it is preferred that the interior angle between the inner side surface and the lower surface is at least 55 degree and less than or equal to 110 degrees.

What is claimed is:

1. A piezoelectric/electrostrictive element comprising:
   a piezoelectric body including a through-hole in communication with a first main surface and a second main surface;

a through-hole electrode formed on an inner side surface of the through-hole;

a first electrode formed on the first main surface of the piezoelectric body, the first electrode connected to the through-hole electrode;

a second electrode formed on the second main surface of the piezoelectric body, the second electrode connected to the through-hole electrode; and a third electrode formed on the second main surface of the piezoelectric body, the third electrode isolated from the second electrode, wherein a calculated average roughness in the inner side surface being larger than 0.11 microns and smaller than 16 microns, and wherein a maximum height roughness in the inner side surface being larger than 0.2 microns and smaller than 20 microns.

2. The piezoelectric/electrostrictive element according to claim 1, wherein when a sectional surface respectively of the inner side surface and the second main surface is expressed linearly by use of a least squares method, an interior angle formed by the inner side surface and the second main surface is at least 55 degrees and less than or equal to 110 degrees.

3. The piezoelectric/electrostrictive element according to claim 1, wherein a plurality of recessed portions is formed on the inner side surface, and an inner portion of the respective plurality of recessed portions is configured as a cavity.

4. The piezoelectric/electrostrictive element according to claim 2, wherein a plurality of recessed portions is formed on the inner side surface, and an inner portion of the respective plurality of recessed portions is configured as a cavity.

5. A method for manufacturing a piezoelectric/electrostrictive element comprising:

forming a through-hole configured to penetrate a piezoelectric body by use of an etching method; and coating an electrode material continuously on an inner side surface of the through-hole and a main surface of the piezoelectric body by use of a coating method, the piezoelectric/electrostrictive element comprising a piezoelectric body including a through-hole in communication with a first main surface and a second main surface, a through-hole electrode formed on an inner side surface of the through-hole;

a first electrode formed on the first main surface of the piezoelectric body, the first electrode connected to the through-hole electrode, a second electrode formed on the second main surface of the piezoelectric body, the second electrode connected to the through-hole electrode, and a third electrode formed on the second main surface of the piezoelectric body, the third electrode isolated from the second electrode, wherein a calculated average roughness in the inner side surface being larger than 0.11 microns and smaller than 16 microns, and wherein a maximum height roughness in the inner side surface being larger than 0.2 microns and smaller than 20 microns.

* * * * *